United States Patent
Lee et al.

(10) Patent No.: US 9,064,720 B2
(45) Date of Patent: Jun. 23, 2015

(54) DECOUPLING CAPACITOR FOR FINFET COMPATIBLE PROCESS

(71) Applicant: Taiwan Semiconductor Manufacturing Company, Ltd., Hsin-Chu (TW)

(72) Inventors: Jam-Wem Lee, Zhubei (TW); Yi-Feng Chang, Xinbei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/753,258

(22) Filed: Jan. 29, 2013

(65) Prior Publication Data
US 2014/0183610 A1    Jul. 3, 2014

Related U.S. Application Data

(60) Provisional application No. 61/746,869, filed on Dec. 28, 2012.

(51) Int. Cl.
- *H01L 27/108* (2006.01)
- *H01L 27/07* (2006.01)
- *H01L 27/08* (2006.01)

(52) U.S. Cl.
CPC .............. *H01L 27/0733* (2013.01); *Y10T 29/41* (2015.01); *H01L 27/0805* (2013.01)

(58) Field of Classification Search
USPC ......................................... 257/532, 300, 308
See application file for complete search history.

(56) References Cited

U.S. PATENT DOCUMENTS

| | | | |
|---|---|---|---|
| 6,995,412 B2 | 2/2006 | Fried et al. | |
| 2003/0193058 A1* | 10/2003 | Fried et al. | 257/200 |
| 2006/0044915 A1 | 3/2006 | Park et al. | |
| 2006/0237726 A1 | 10/2006 | Iwamatsu et al. | |
| 2006/0255389 A1 | 11/2006 | Maeda | |
| 2009/0134472 A1* | 5/2009 | Inaba | 257/390 |
| 2009/0280582 A1* | 11/2009 | Thijs et al. | 438/14 |

FOREIGN PATENT DOCUMENTS

| | | |
|---|---|---|
| JP | 2006303377 | 11/2006 |
| KR | 100591770 | 6/2006 |
| KR | 100688546 | 3/2007 |

OTHER PUBLICATIONS

Thijs et al "Design methodology of FinFET devices that meet IC-Level HBM ESD targets" Electrical Overstress/Electrostatic Discharge Symposium, 2008. EOS/ESD 2008. 30th ; Sep. 7-11, 2008 pp. 294-302.*

* cited by examiner

*Primary Examiner* — Cuong Q Nguyen
*Assistant Examiner* — Nishath Yasmeen
(74) *Attorney, Agent, or Firm* — Slater & Matsil, L.L.P.

(57) ABSTRACT

A decoupling capacitor formed from a fin field-effect transistor (FinFET) and method of using the same are provided. An embodiment decoupling capacitor includes a fin field-effect transistor (FinFET) having a semiconductor substrate supporting a gate stack, a source, and a drain, a first terminal coupled to the semiconductor substrate and to the gate stack, the first terminal configured to couple with a first power rail, and a second terminal coupled to the source and to the drain, the second terminal configured to couple with a second power rail having a higher potential than the first power rail.

20 Claims, 6 Drawing Sheets

| | Leakage (A/fF) |
|---|---|
| Conventional | 9.06e-6 |
| Embodiment | 1.73e-8 |

DECOUPLING CAPACITOR FOR FINFET COMPATIBLE PROCESS

CROSS-REFERENCE TO RELATED APPLICATIONS

This application claims the benefit of U.S. Provisional Application No. 61/746,869, filed on Dec. 28, 2012, entitled "Decoupling Capacitor for Finfet Compatible Process," which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

A MOSFET may be incorporated into a circuit to function as a decoupling capacitor, which decouples one part of a circuit from another. In such circumstances, the device may be referred to as a metal-oxide-semiconductor capacitor (MOSC). As known in the art, the conventional MOSC is a two terminal MOS device. Unfortunately, the conventional MOSC may experience an undesirably high gate leakage.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely decoupling capacitor and circuit containing the same. The invention may also be applied, however, to other devices, electronic structures, and the like.

Figure 1:
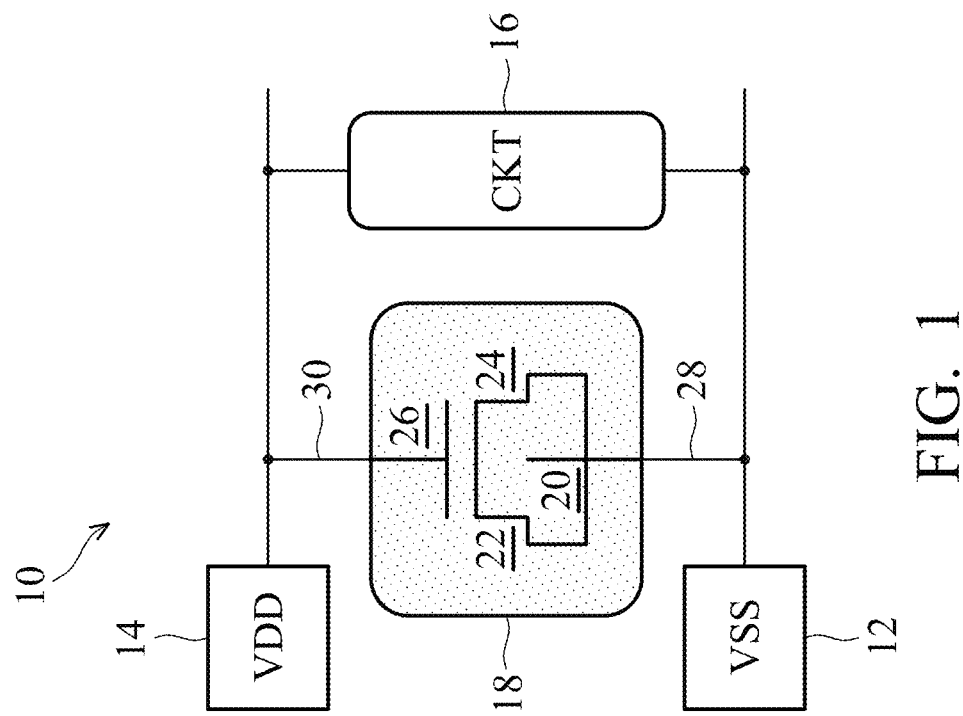
FIG. 1 illustrates a conventional decoupling capacitor circuit.

Referring now to FIG. 1, a conventional decoupling capacitor circuit 10 is illustrated for the purpose of reference. As shown, the conventional decoupling capacitor circuit 10 includes a first voltage source 12 (e.g., Vss), a second voltage source 14 (e.g., Vdd), a circuit 16 to be decoupled, and a conventional metal-oxide-semiconductor capacitor (MOSC) 18, which is a planar semiconductor device. The second voltage source 14 generally has a higher voltage or potential than the first voltage source 12. The first voltage source 12 may be a negative supply voltage or a ground and the second voltage source may be a positive supply voltage.

Still referring to FIG. 1, the conventional MOSC 18 includes a semiconductor substrate 20, a source 22, a drain 24, and a gate 26. As used herein, the term semiconductor substrate 20 of the conventional MOSC 18 is intended to include both the bulk and channel (or well) regions of the device. As shown in FIG. 1, a first terminal 28 of the conventional MOSC 18 is operably coupled to the semiconductor substrate 20, the source 22, and the drain 24. The first terminal 28 is also operably coupled to the first voltage source 12. A second terminal 30 of the conventional MOSC 18 is operably coupled to the gate 26 and the second voltage source 14.

Figure 2:
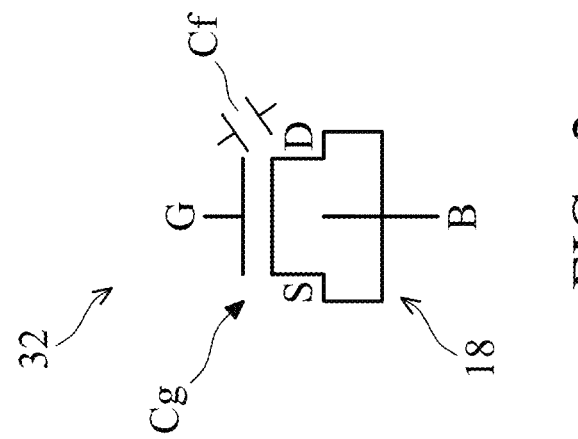
FIG. 2 illustrates a simplified circuit model of the conventional metal-oxide-semiconductor capacitor (MOSC) within the decoupling capacitor circuit of FIG. 1.

Referring now to FIG. 2, a simplified circuit model 32 of the conventional MOSC 18 within the conventional decoupling capacitor circuit 10 of FIG. 1 is provided. As shown in FIG. 2, the conventional MOSC 18 provides a gate capacitance (Cg) and a fringing capacitance (Cf). The gate capacitance (Cg) is generally generated between the semiconductor substrate 20 (labeled B, for bulk) and the gate 26 (labeled G) while the fringing capacitance is generated at the edges of the capacitor as represented proximate the source 22 and drain 24 (labeled S and D, respectively). Unfortunately, and as will be more fully explained below, the conventional MOSC 18 shown in FIGS. 1-2 suffers from an undesirable or unacceptable amount of gate leakage.

Figure 3:
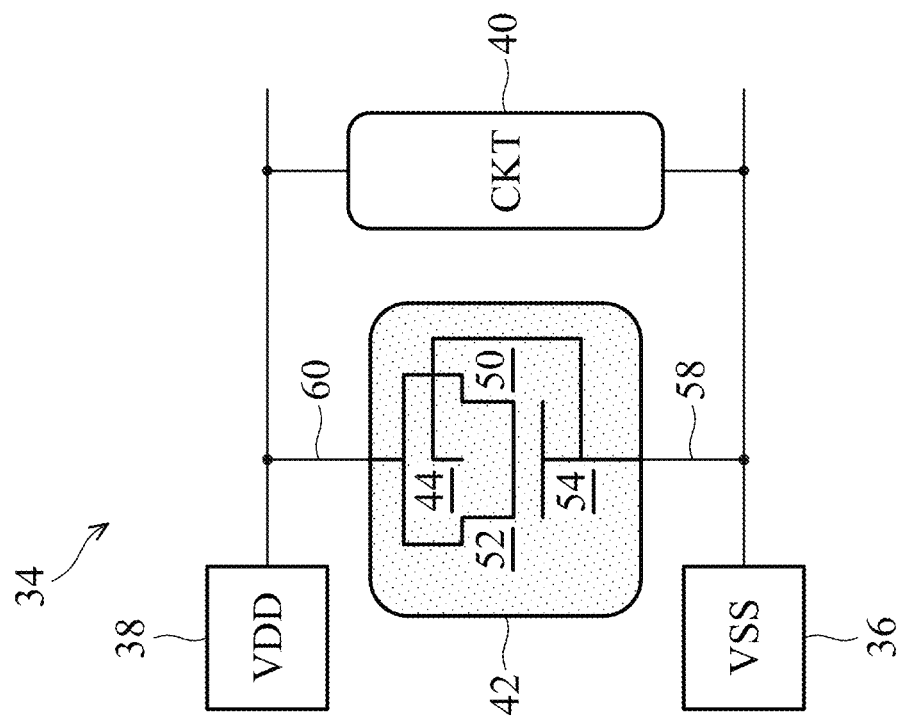
FIG. 3 illustrates an embodiment decoupling capacitor circuit.

Referring now to FIG. 3, an embodiment decoupling capacitor circuit 34 is illustrated. As shown, the embodiment decoupling capacitor circuit 34 includes a first voltage source 36 (a.k.a., Vss, first voltage supply, first power rail, etc.), a second voltage source 38 (a.k.a., Vdd, second voltage supply, second power rail, etc.), a circuit 40 to be decoupled, and a fin field-effect transistor (FinFET) 42. The second voltage source 38 generally has a higher voltage or potential than the first voltage source 36. In an embodiment, the first voltage source 36 is a negative supply voltage or a ground and the second voltage source is a positive supply voltage. As will be more fully explained below, the FinFET 42 of FIG. 3 is configured to function as a MOSC in order to decouple the circuit 40.

Figure 4:
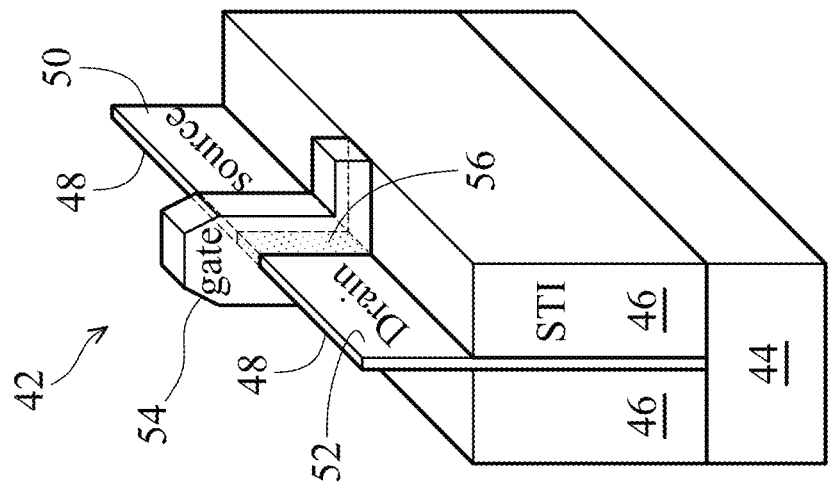
FIG. 4 illustrates a fin field-effect transistor (FinFET) from the decoupling capacitor circuit of FIG. 3.

Referring now to FIG. 4, the FinFET 42 of FIG. 3 is illustrated in further detail. As shown in FIG. 4, the FinFET 42 includes a semiconductor substrate 44. The semiconductor substrate 44 may be bulk silicon, germanium, silicon germanium, a silicon-containing material, or another suitable semiconductor material. Isolation regions, such as shallow trench isolation (STI) regions 46 may be formed over the semiconductor substrate 44. In addition, a semiconductor fin 48 is formed above top surfaces of the STI regions 46.

In an embodiment, the semiconductor fin 48 is formed by forming STI regions 46 first, and then recessing the top surface of STI regions 46 to a level lower than the original top surface of the semiconductor substrate 44. The remaining portions of semiconductor substrate 44 between the STI regions 46 thus become the semiconductor fin 48. In an embodiment, the semiconductor fin 48 is formed of a material different from that of the semiconductor substrate 44.

In an embodiment, the semiconductor fin 48 is formed by recessing top portions of the semiconductor substrate 44 between neighboring STI regions 46 to form a recess, and re-growing a semiconductor material different from that of semiconductor substrate 44 in the recesses. Thereafter, top portions of the STI regions 46 are then be removed, while bottom portions of the STI regions 46 remain. As such, the top portions of the re-grown semiconductor material between neighboring STI regions 46 become the semiconductor fin 48. The semiconductor fin 48 may have channel dopings either introduced through implantations, or through in-situ doping performed simultaneously with the growth of semiconductor fin 48.

Still referring to FIG. 4, a source 50 and a drain 52 are formed in the semiconductor fin 48 on opposing sides of a gate 54 (i.e., gate stack). As shown, the gate 54 wraps around and follows the profile of the semiconductor fin 48. A channel region 56 is disposed in the semiconductor fin 48 beneath the gate 54 and between the source 50 and the drain 52. In an embodiment, the FinFET 42 is a single gate oxide FinFET suitable for high voltage applications (e.g., voltage of between about 1 V and about 5 V).

Referring collectively to FIGS. 3-4, in an embodiment the FinFET 42 is an n-type FinFET. As such, a first terminal 58 of the FinFET 42 is operably coupled to the semiconductor substrate 44 and the gate 54 and the first voltage source 36. In addition, a second terminal 60 of the FinFET 42 is operably coupled to the source 50, the drain 52, and the second voltage source 38. In another embodiment, the FinFET 42 is a p-type FinFET. As such, a first terminal 58 of the FinFET 42 is operably coupled to the semiconductor substrate 44 and the gate 54 and the second voltage source 38. In addition, a second terminal 60 of the FinFET 42 is operably coupled to the source 50, the drain 52, and the first voltage source 36.

In an embodiment, the FinFET 42 and the circuit 40 to be decoupled are coupled to the first and second voltage sources 36, 38 such that the FinFET 42 and the circuit 40 to be decoupled are in parallel with each other within the embodiment decoupling capacitor circuit 34 as shown in FIG. 3.

Figures 5, 6:
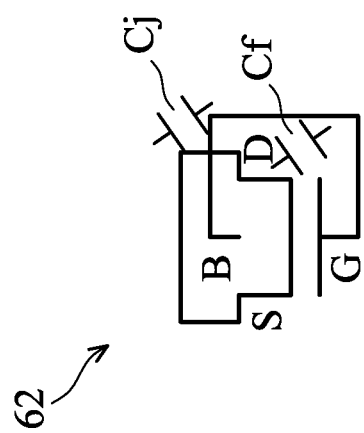
FIG. 5 illustrates a simplified circuit model of the FinFET of FIG. 4 within the decoupling capacitor circuit of FIG. 3.
FIG. 6 is a table comparing the capacitance offered by the conventional MOSC of FIGS. 1-2 and by the FinFET of FIGS. 3-5.

Referring now to FIG. 5, a simplified circuit model 62 of the FinFET 42 in the embodiment decoupling capacitor circuit 34 of FIG. 3 is provided. As shown in FIG. 5, the FinFET 42 provides a junction capacitance (Cj) and a fringing capacitance (Cf). The junction capacitance (Cj) is generated between the source 50/drain 52 (labeled S and D, respectively) and the semiconductor substrate 44 (labeled B, for bulk) while the fringing capacitance generated at the edges of the capacitor between the gate 54 (labeled G) and the source 50/drain 52.

As will be more fully explained below, the FinFET 42 shown in FIGS. 3-5 has significantly less gate leakage relative to the conventional MOSC 18 of FIGS. 1-2. Indeed, because there is no potential difference between the gate 54 and the semiconductor substrate 44, there is no gate leakage.

In an embodiment, a reverse diode (source 50/drain 52 to semiconductor substrate 44) is formed in the FinFET 42 when the first and second terminals 58, 60 are coupled to or between the first and second voltage sources 36, 38. The reverse diode has a leakage current that is lower than the gate leakage of the conventional MOSC 18 of FIG. 1.

Figure 7:
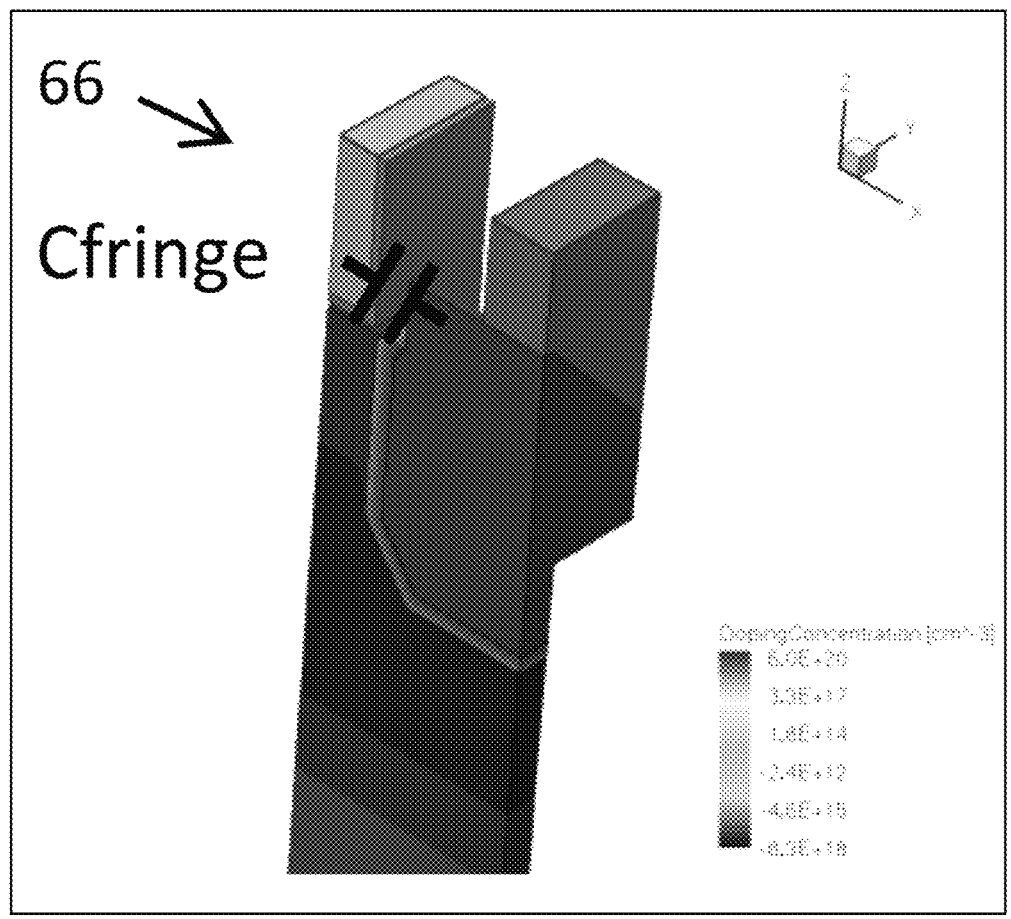
FIG. 7 is a doping concentration model depicting the fringe capacitance of the FinFET of FIGS. 3-5.

Referring now to FIG. 6, a table 64 comparing the capacitance offered by the conventional MOSC 18 of FIGS. 1-2 and by the FinFET 42 of FIGS. 3-5 is provided. As shown, the conventional MOSC 18, which is a planar device, provides about 0.5 femtofarads per square micrometer ($fF/\mu m^2$) while the FinFET 42, which is a three-dimensional device, provides about 0.87 femtofarads per square micrometer ($fF/\mu m^2$). The increase in capacitance is due, at least in part, to the higher amount of fringe capacitance generated by the FinFET 42, which is represented in the doping concentration model 66 of FIG. 7.

Figure 8:
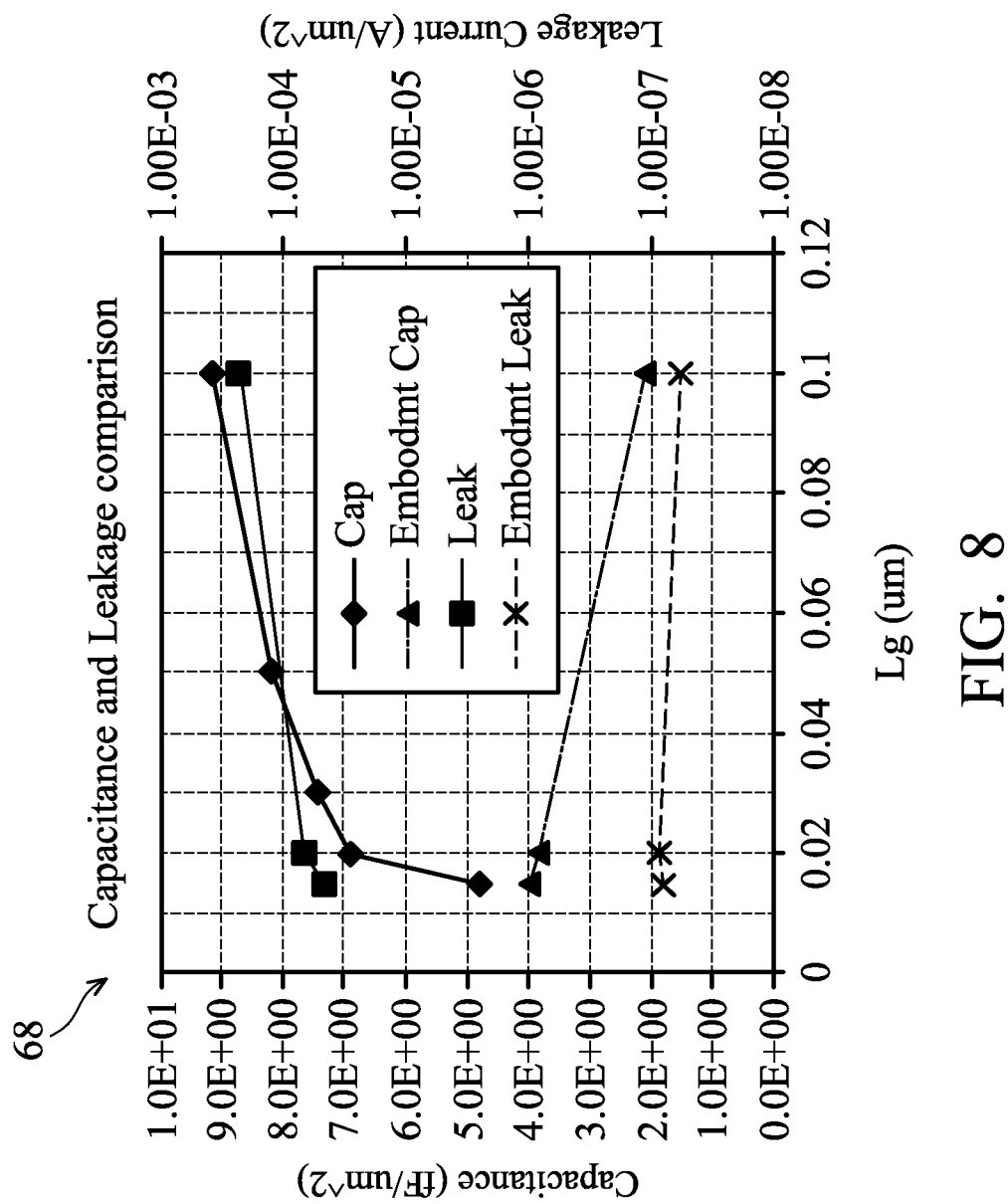
FIG. 8 is a chart comparing the capacitance and leakage of the conventional MOSC of FIGS. 1-2 and the FinFET of FIGS. 3-5.

Referring now to FIG. 8, a chart 68 comparing the capacitance and leakage of the conventional MOSC 18 and the FinFET 42 is provided. As shown, the conventional MOSC 18 is able to provide a total capacitance of between about 5.0 femtofarad per square micrometer ($fF/\mu m^2$) to about 9.0 femtofarad per square micrometer ($fF/\mu m^2$) over a channel length of between about 0.02 µm and about 0.1 µm. However, the conventional MOSC 18 suffers from a leakage current greater than about $5.0 \times 10^{-5}$ amps per square micrometer ($A/\mu m^2$) over that channel length. Indeed, the leakage current of the conventional MOSC 18 is greater than about $1.0 \times 10^{-4}$ amps per square micrometer ($A/\mu m^2$) when the channel length is about 0.1 µm.

As shown by the chart 68 in FIG. 8, when the conventional MOSC 18 is scaled down, the leakage current stays fairly consistent, however, the capacitance drops off abruptly as the channel length decreases. In contrast, when the FinFET 42 is scaled down, the leakage current stays fairly consistent and the capacitance increases as the channel length decreases. Indeed, the FinFET 42 reduces the leakage current by about one order while maintaining about the same capacitance.

Still referring to FIG. 8, the FinFET 42 of FIGS. 3-5 is able to provide a total capacitance of between about 4.0 femtofarad per square micrometer ($fF/\mu m^2$) and about 2.0 femtofarad per square micrometer ($fF/\mu m^2$) over a channel length of between about 0.02 µm and about 0.1 µm. The FinFET 42 is also configured to have a leakage current of less than about $1.0 \times 10^{-7}$ amps per square micrometer ($A/\mu m^2$) over a channel length of between about 0.02 µm and about 0.1 µm.

Figures 9, 10:
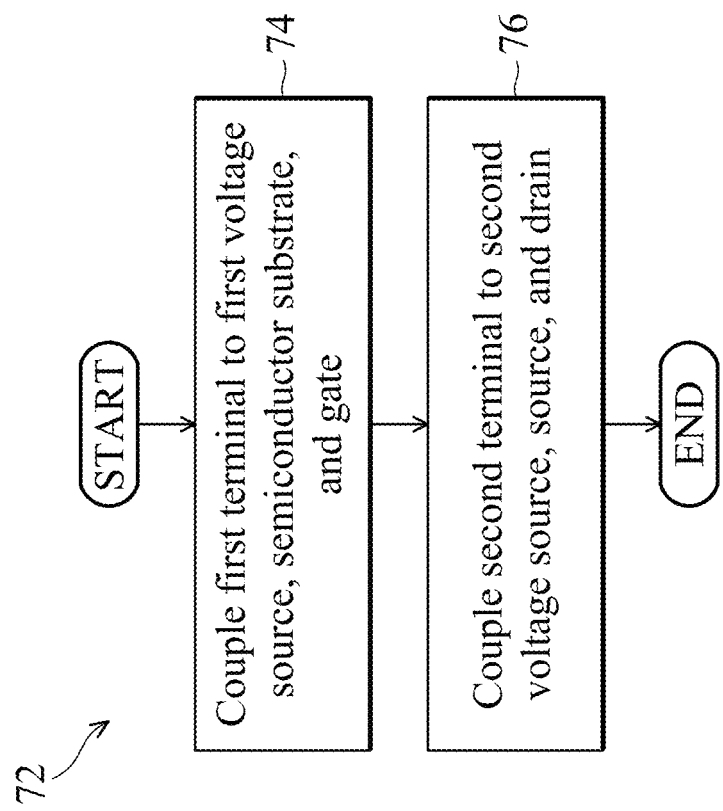
FIG. 9 is a table comparing a ratio of leakage current to capacitance of the conventional MOSC of FIGS. 1-2 and the FinFET of FIGS. 3-5.
FIG. 10 is an embodiment method of using the FinFET of FIGS. 3-5 as a decoupling capacitor.

Referring now to the table 70 of FIG. 9, the conventional MOSC of FIG. 1 was found to have a leakage of about $9.06 \times 10^{-6}$ amps per femtofarad (A/fF) for a channel length of 0.02 µm. In contrast, the FinFET of FIGS. 3-5 was found to have a leakage of less than about $1.73 \times 10^{-8}$ amps per femtofarad (A/fF) for a channel length of 0.02 µm. Therefore, the FinFET 42 provides a more favorable ratio of leakage current to capacitance.

Referring now to FIG. 10, an embodiment method 72 of using a FinFET 42 as a decoupling capacitor is illustrated. In block 74, the first terminal 58 of the FinFET 42 is coupled to the first voltage source 36, to the semiconductor substrate 44 of the FinFET 42, and to the gate 54 of the FinFET 42. In block 76, the second terminal 60 of the FinFET 42 is coupled to the second voltage source 38, to the source 50 of the FinFET 42, and to the drain 52 of the FinFET 42. While the method 72 of using the FinFET 42 describes connections for an n-type FinFET, it should be recognized that the connections in the method 72 may be modified for a p-type FinFET as noted above.

In an embodiment, the first terminal 58 of the FinFET 42 is coupled to the first voltage source 36 and the second terminal 60 of the FinFET 42 is coupled to the second voltage source 38 such that the FinFET 42 is in parallel with the circuit 40 to be decoupled, as shown in FIG. 3.

From the foregoing, it should be recognized that using the FinFET 42, which functions as a MOSC, has a reduced gate leakage for high voltage applications without having to use a dual gate oxide process. In addition, the FinFET 42 provides better capacitance when the device is downsized compared to the conventional MOSC 18. Indeed, the FinFET 42 has lower leakage by gate leak suppressing. Moreover, the FinFET 42 has better capacitance performance with a shorter channel than the conventional MOSC 18.

An embodiment decoupling capacitor includes a fin field-effect transistor (FinFET) having a semiconductor substrate supporting a fin disposed between isolation regions, the fin including a source and a drain on opposing sides of a channel region beneath a gate stack, a first terminal coupled to the semiconductor substrate and to the gate stack, the first terminal configured to couple with a first power rail, and a second terminal coupled to the source and to the drain, the second terminal configured to couple with a second power rail.

An embodiment decoupling capacitor circuit includes a first voltage source, a second voltage source having a higher voltage than the first voltage source, a circuit coupled to the first voltage source and the second voltage source, and a fin field-effect transistor (FinFET) having a first terminal and a second terminal, the first terminal coupled to the first voltage source, to a semiconductor substrate of the FinFET, and to a gate stack of the FinFET, the second terminal coupled to the second voltage source, to a source of the FinFET, and to a drain of the FinFET.

An embodiment method of using a fin field-effect transistor (FinFET) as a decoupling capacitor includes coupling a first terminal of the FinFET to a first voltage source, to a semiconductor substrate of the FinFET, and to a gate stack of the FinFET, and coupling a second terminal of the FinFET to a second voltage source, to a source of the FinFET, and to a drain of the FinFET.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A device comprising:
   capacitor having a semiconductor substrate supporting a fin disposed between isolation regions, the fin including a first region and a second region on opposing sides of a third region beneath a gate stack;
   a first terminal coupled to the semiconductor substrate and to the gate stack such that the semiconductor substrate and the gate stack have a same potential, the first terminal configured to couple with a first power rail; and
   a second terminal coupled to the first region and to the second region, the second terminal configured to couple with a second power rail.

2. The device of claim 1, wherein the second power rail has a higher potential than the first power rail.

3. The device of claim 1, wherein the capacitor is configured to provide a total capacitance of greater than about 0.5 femtofarad per square micrometer ($fF/\mu m^2$).

4. The device of claim 1, wherein the capacitor is configured to provide a total capacitance of greater than about 0.8 femtofarad per square micrometer ($fF/\mu m^2$).

5. The device of claim 1, wherein the capacitor is configured to have a total capacitance of between about 4.0 femtofarad per square micrometer ($fF/\mu m^2$) and about 2.0 femtofarad per square micrometer ($fF/\mu m^2$) over a third region length of between about 0.02 $\mu m$ and about 0.1 $\mu m$.

6. The device of claim 1, wherein the capacitor is configured to have a leakage current of less than about $1.0 \times 10^{-7}$ amps per square micrometer ($A/\mu m^2$) over a third region length of between about 0.02 $\mu m$ and about 0.1 $\mu m$.

7. The device of claim 1, wherein the capacitor is configured to have a leakage of less than about $1.5 \times 10^{-8}$ amps per femtofarad ($A/fF$).

8. The device of claim 1, wherein a fringing capacitance may be generated by the gate stack and the semiconductor substrate when coupled to the first power rail and a junction capacitance may be generated by the first region and the second region when coupled to the second power rail.

9. A device comprising:
   a first voltage source;
   a second voltage source different from the first voltage source;
   a circuit coupled to the first voltage source and the second voltage source; and
   a capacitor comprising a semiconductor substrate having a fin extending therefrom and a gate stack over the fin, the capacitor having a first terminal and a second terminal, the first terminal coupled to the first voltage source, to the semiconductor substrate of the capacitor, and to the gate stack of the FinFET capacitor, the second terminal coupled to the second voltage source, to a first plate region of the fin, and to a second plate region of the fin, the first plate region of the fin and the second plate region of the fin being disposed on opposing sides of the gate stack, wherein the semiconductor substrate and the gate stack are coupled to have a potential difference equal to zero.

10. The device of claim 9, wherein the capacitor is coupled to the first voltage source and to the second voltage source in parallel with the circuit.

11. The device of claim 9, wherein the capacitor is configured to provide a total capacitance of greater than about 0.8 femtofarad per square micrometer ($fF/\mu m^2$).

12. The device of claim 9, wherein the capacitor is configured to have a total capacitance of between about 4.0 femtofarad per square micrometer ($fF/\mu m^2$) and about 2.0 femtofarad per square micrometer ($fF/\mu m^2$) over a gate length of between about 0.02 $\mu m$ and about 0.1 $\mu m$.

13. The device of claim 9, wherein the capacitor is configured to have a leakage current of less than about $1.0 \times 10^{-7}$ amps per square micrometer ($A/\mu m^2$) over a gate length of between about 0.02 $\mu m$ and about 0.1 $\mu m$.

14. The device of claim 9, wherein the capacitor is configured to have a leakage of less than about $1.5 \times 10^{-8}$ amps per femtofarad ($A/fF$).

15. A method comprising:
   coupling a first terminal of a FinFET to a first voltage source, to a semiconductor substrate of the FinFET, and to a gate stack of the FinFET, wherein the semiconductor substrate and the gate stack are configured to have a first potential; and coupling a second terminal of the FinFET to a second voltage source, to a source of the FinFET, and to a drain of the FinFET, wherein the source and the drain are configured to have a second potential different from the first potential, thereby forming a capacitor.

16. The method of claim 15, further comprising providing the second voltage source with a higher voltage than the first voltage source and coupling the first terminal to the first voltage source and the second terminal to the second voltage source such that the capacitor is in parallel with a circuit to be decoupled.

17. The method of claim 15, further comprising generating a total capacitance of greater than about 0.5 femtofarad per square micrometer ($fF/\mu m^2$).

18. The method of claim 15, further comprising generating a total capacitance of between about 4.0 femtofarad per square micrometer ($fF/\mu m^2$) and about 2.0 femtofarad per square micrometer ($fF/\mu m^2$) over a channel length of between about 0.02 μm and about 0.1 μm.

19. The method of claim 15, further comprising producing a leakage current of less than about $1.0 \times 10^{-7}$ amps per square micrometer ($A/\mu m^2$) over a channel length of between about 0.02 μm and about 0.1 μm.

20. The device of claim 9, further comprising a first isolation region and a second isolation region over the semiconductor substrate, the fin being interposed between the first isolation region and the second isolation region.

* * * * *

UNITED STATES PATENT AND TRADEMARK OFFICE
CERTIFICATE OF CORRECTION

| | | |
|---|---|---|
| PATENT NO. | : 9,064,720 B2 | Page 1 of 1 |
| APPLICATION NO. | : 13/753258 | |
| DATED | : June 23, 2015 | |
| INVENTOR(S) | : Lee et al. | |

It is certified that error appears in the above-identified patent and that said Letters Patent is hereby corrected as shown below:

In the claims

Col. 6, line 36, claim 9, delete "FinFET".

Signed and Sealed this
Twenty-fourth Day of November, 2015

Michelle K. Lee
*Director of the United States Patent and Trademark Office*